United States Patent [19]
Ohtani et al.

[11] Patent Number: 5,963,753
[45] Date of Patent: Oct. 5, 1999

[54] SUBSTRATE PROCESSING APPARATUS

[75] Inventors: Masami Ohtani; Minobu Matsunaga; Tutomu Ueyama; Ryuji Kitakado; Kaoru Aoki; Masao Tsuji, all of Kyoto, Japan

[73] Assignee: Dainippon Screen Mfg. Co., Ltd., Japan

[21] Appl. No.: 09/009,100

[22] Filed: Jan. 20, 1998

[30] Foreign Application Priority Data

Jan. 24, 1997 [JP] Japan ..................................... 9-011001
Sep. 29, 1997 [JP] Japan ..................................... 9-263068

[51] Int. Cl.[6] ...................................................... G03D 5/00
[52] U.S. Cl. ............................. 396/611; 414/225; 118/719
[58] Field of Search ..................................... 396/604, 611; 414/410, 414, 416, 422, 425, 937, 941; 118/719, 52

[56] References Cited

U.S. PATENT DOCUMENTS

| | | | |
|---|---|---|---|
| 5,339,128 | 8/1994 | Tateyama et al. ...................... | 396/604 |
| 5,364,222 | 11/1994 | Akimoto et al. ........................ | 414/416 |
| 5,445,484 | 8/1995 | Kato et al. .............................. | 414/416 |
| 5,664,254 | 9/1997 | Ohkura et al. .......................... | 396/612 |
| 5,695,564 | 12/1997 | Imahashi ................................ | 118/719 |

*Primary Examiner*—D. Rutledge
*Attorney, Agent, or Firm*—Ostrolenk, Faber, Gerb & Soffen, LLP

[57] ABSTRACT

A substrate processing apparatus comprises a first substrate transfer unit having a first transfer path and a second substrate transfer unit having a second transfer path. A spin coating unit and a spin developing unit are arranged along the first transfer path, and a substrate cassette is arranged along the second transfer path. A substrate transport robot of the second substrate transfer unit selectively introduces a substrate received from a substrate transport robot of the first substrate transfer unit in one of external exposure apparatuses arranged on both end portions of the second transfer path, and discharges the substrate from the exposure apparatus for transfering the same to the substrate transport robot of the first substrate transfer unit. Thereby the substrate processing apparatus can avoid or relieve reduction of operational efficiency even if its throughput is different from that of an exposure apparatus.

21 Claims, 14 Drawing Sheets

SUBSTRATE PROCESSING APPARATUS

BACKGROUND OF THE INVENTION

1. Field of the Invention

The present invention relates to a substrate processing apparatus for performing prescribed processes on a substrate.

2. Description of the Background Art

A substrate processing apparatus is employed for performing various processes on a substrate such as a semiconductor wafer, a glass substrate for a liquid crystal display, a photomask or an optical disk, or the like. In a process of fabricating a semiconductor device, for example, a substrate processing apparatus prepared by unifying respective ones of a series of processes and integrating a plurality of substrate processing units with each other is employed for improving production efficiency.

In a photolithography step, the substrate processing apparatus performs various types of substrate processes around an exposure process, and an exposure apparatus performs the exposure process. In this case, the substrate processing apparatus is provided with various substrate processing units such as a spin coating unit (spin coater) for applying a photoresist to the substrate, a spin developing unit (spin developer) for developing the substrate, a heating unit (hot plate) for heating the substrate and a cooling unit (cooling plate) for cooling the substrate, and a substrate transport unit for transporting the substrate between the substrate processing units.

On the other hand, the exposure apparatus comprises an exposure part such as a reduction project exposer (stepper) or the like, an alignment mechanism for positioning the substrate for the exposure part to print an exposure pattern thereon, a transport robot for transporting the substrate in the exposure apparatus, and the like.

In the photolithography step, the substrate processing apparatus first processes the substrate before the exposure process, then the exposure apparatus exposes the substrate, and thereafter the substrate processing apparatus processes the substrate again. Therefore, the substrate needs to be transferred between the substrate processing apparatus and the exposure apparatus. For this reason, the substrate processing apparatus is provided with the substrate transport unit for transferring the substrate. This substrate transport unit is called an interface unit (hereinafter referred to as an IF unit).

FIG. 1 is a plan view of a conventional substrate processing apparatus 200 comprising an IF unit 180, and FIGS. 2 and 3 are front and side elevational views of the IF unit 180 shown in FIG. 1 respectively.

Referring to FIG. 1, the substrate processing apparatus 200 comprises a plurality of spin coating units 160a, a plurality of spin developing units 160b, a substrate transport unit 170 and the IF unit 180. An exposure apparatus 300 is provided on one end portion of the substrate processing apparatus 200, to be adjacent to the IF unit 180.

The substrate transport unit 170 has a substrate transport robot 171 for transporting each substrate W in the X-axis direction (along arrow X). The IF unit 180 has a substrate transport robot 181. The substrate transport robot 181 includes a substrate holding part 182 for holding the substrate W, an X-axis direction moving mechanism 183 for moving the substrate holding part 182 in the X-axis direction, a Z direction moving mechanism 184 for moving the substrate holding part 182 in the Z-axis direction (along arrow Z) through the X direction moving mechanism 183, and a Y direction moving mechanism 185 for moving the substrate holding part 182 in the Y-axis direction (along arrow Y) through the Z direction moving mechanism 184 and the X direction moving mechanism 183.

Thus, the substrate transport robot 181 holds each substrate W on the substrate holding part 182 and moves the same in the X-, Y- and Z-axis directions, so that the substrate W can be transferred to and received from a substrate transfer table 190, a substrate introduction table 191, a substrate discharge table 192 and a buffer part 193.

The substrate transfer table 190 is employed for transferring and receiving the substrate W to and from the substrate transport robots 181 and 171. The substrate introduction table 191 and the substrate discharge table 192 are employed for transferring and receiving the substrate W to and from the substrate transport robot 181 and a substrate transport robot (not shown) provided in the exposure apparatus 300. As shown in FIG. 2, the IF unit 180 is provided on its side surface with an opening 186 for transferring and receiving the substrate W to and from the exposure apparatus 300. The buffer part 193 is employed for temporarily storing the substrate W when a difference is caused between processing times in the substrate processing apparatus 200 and the exposure apparatus 300.

In this substrate processing apparatus 200, the substrate transport robot 171 of the substrate transport unit 170 places the substrate W processed in any spin coating unit 160a on the substrate transfer table 190. The substrate transport robot 181 of the IF unit 180 receives the substrate W placed on the substrate transfer table 190 for holding the same in the substrate holding part 182, and places the substrate W on the substrate introduction table 191. The substrate W placed on the substrate introduction table 191 is introduced into the exposure apparatus 300 by the substrate transport robot provided therein.

The substrate W exposed in the exposure apparatus 300 is discharged from the exposure apparatus 300 by the substrate transport robot provided therein, and placed on the substrate discharge table 192. The substrate transport robot 181 of the IF unit 180 receives the substrate W placed on the substrate discharge table 192 for holding the same in the substrate holding part 182, and places the substrate W on the substrate transfer table 190. The substrate transport robot 171 of the substrate transport unit 170 transports the substrate W placed on the substrate transfer table 190 to any spin developing unit 160b.

In general, the time required by the exposure apparatus 300 for exposing the substrate W is longer than the times required by each spin coating unit 160a and each spin developing unit 160b of the substrate processing apparatus 200 for processing the substrate W. Particularly in case of processing a substrate having a large diameter of 300 mm, the exposure time in the exposure apparatus 300 is increased.

Thus, the throughput of the conventional substrate processing apparatus 200 is incoincident with that of the exposure apparatus 300, and hence the operating efficiency of the substrate processing apparatus 200 is disadvantageously reduced.

SUMMARY OF THE INVENTION

According to the present invention, a substrate processing apparatus comprises: a) a processing section comprising: a-1) substrate processing means for processing a substrate; and b) a transfer section provided adjacent to the processing section, comprising: b-1) transfer path defined along one side of the processing section; and b-2) transfer means movable along the transfer path for transferring the substrate between the processing section and both terminals of the transfer path, capable introducing and discharging a substrate into and from said transfer path in both terminals of said transfer path.

Two external apparatuses can be provided in the exterior of both terminals of the transfer path, and reduction of operational efficiency of the substrate processing apparatus can be avoided or relieved by distributing substrates processed in the substrate processing means to two external apparatuses, even if the processing times in the external apparatuses are longer than that in the substrate processing apparatus.

Preferably, the substrate processing apparatus further comprises: c) a substrate station provided on an opposite side of the processing section across the transfer path.

In accordance the present invention, the transfer means is capable of efficiently transferring a substrate between the substrate station, the substrate processing means, and the two external apparatuses.

Preferably, in the substrate processing apparatus, the transfer means comprises: b-2-1) first substrate-transfer means capable of having access to the substrate processing means and the substrate station; and b-2-2) second substrate-transfer means comprising: a first transfer unit capable of having access to one terminal of the transfer path and said first substrate-transfer means, and a second transfer unit capable of having access to the other terminal of the transfer path and said first substrate-transfer means.

The moving distance of the first substrate means in the transfer path is reduced and the substrate transfer efficiency of the first substrate transfer means is improved. This further improves the operational efficiency of the substrate processing apparatus.

Preferably, in the substrate processing apparatus, the transfer means comprises: b-2-1) first substrate-transfer means capable of having access to the substrate station; b-2-2) second substrate-transfer means comprising: a first transfer unit capable of having access to one terminal of the transfer path, and a second transfer unit capable of having access to the other terminal of the transfer path, and b-2-3) third substrate-transfer means capable of having access to the substrate processing means, the first substrate-transfer means and the second substrate-transfer means.

In accordance with the present invention, the third substrate-transfer means is capable of temporarily holding the substrate, thereby facilitating the adjustment of inconsistency in throughput of the substrate processing means and the external apparatuses and eliminating waste of time in the substrate processing apparatus.

An object of the present invention is to provide a substrate processing apparatus which can avoid or relieve reduction of operating efficiency even if its throughput is different from that of an external apparatus.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 4:
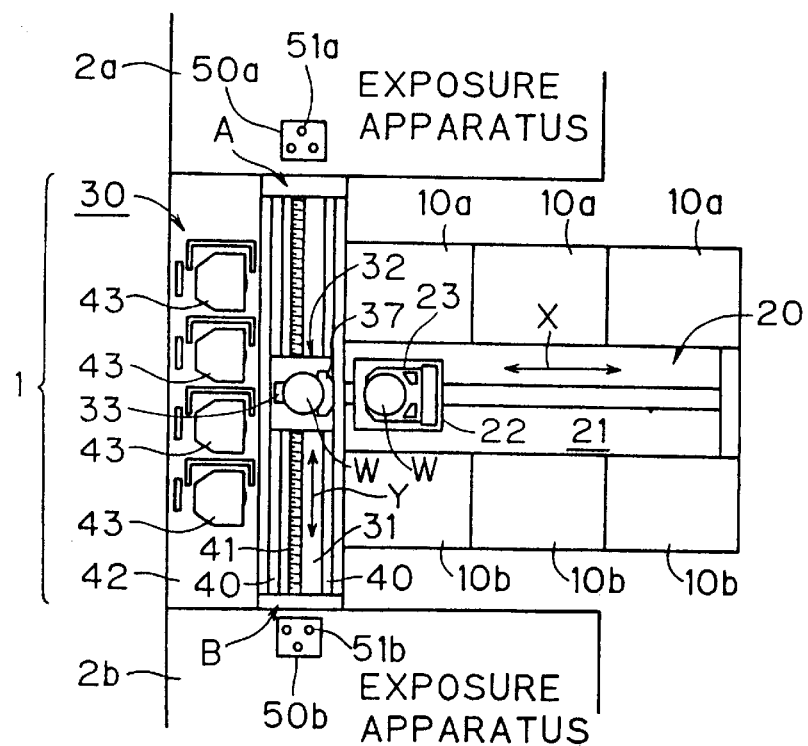
FIG. 4 is a plan view of a substrate processing apparatus according to a first embodiment of the present invention.
Figure 5:
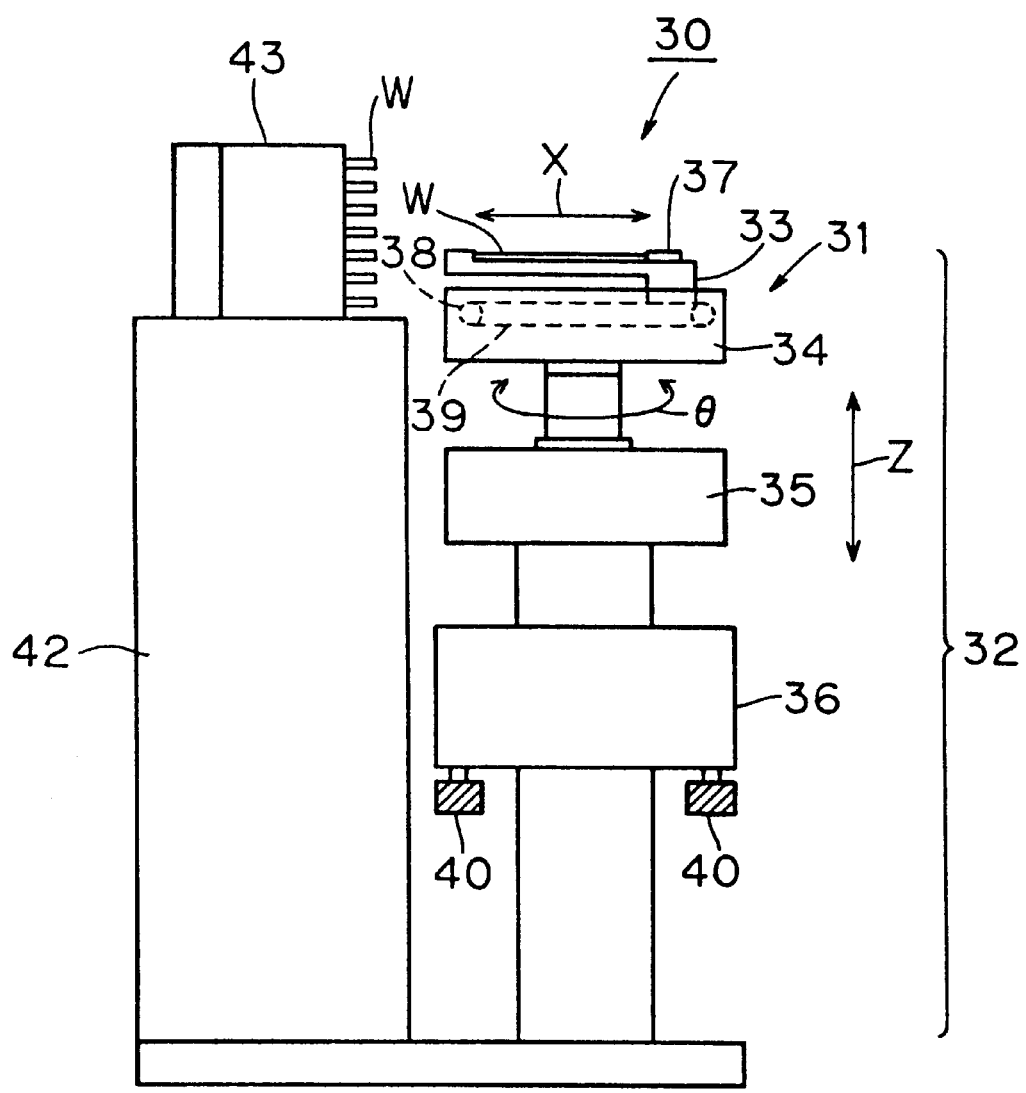
FIG. 5 is a side elevational view of a second substrate transfer unit in the substrate processing apparatus shown in FIG. 4.

FIG. 4 is a plan view of a substrate processing apparatus 1 according to a first embodiment of the present invention, and FIG. 5 is a side elevational view of a second substrate transfer unit 30 provided in the substrate processing apparatus 1 shown in FIG. 4.

Referring to FIG. 4, the substrate processing apparatus 1 comprises a plurality of spin coating units (spin coaters) 10a for coating a photoresist solution to each substrate W, a plurality of spin developing units (spin developers) 10b for developing each substrate W, and first and second substrate transfer units 20 and 30 for transfering each substrate W.

The first substrate transfer unit 20 has a first transfer path 21 extending in the X-axis direction (along arrow X). A substrate transport robot 22 is provided on the first transfer path 21 to be movable in the X-axis direction and the vertical direction and rotatable about a vertical axis. A substrate holding arm 23 for holding each substrate W is provided above the substrate transport robot 22 to be advanceable and retretable.

The plurality of spin coating units 10a are arranged on one side portion of the first transfer path 21, while the plurality of spin developing units 10b are arranged along the other side portion of the first transfer path 21. A heating unit (hot plate) (not shown) for heating each substrate W and a cooling unit (cooling plate) (not shown) for cooling each substrate W are arranged above the spin coating units 10a and the spin developing units 10b.

The second substrate transfer unit 30 has a second transfer path 31 extending in a direction perpendicular to the first transfer path 21, i.e., in the Y-axis direction (along arrow Y) on one end portion of the first transfer path 21. A substrate transport robot 32 is provided on the second transfer path 31 to be movable in the Y-axis direction and the vertical direction and rotatable about a vertical axis. A substrate holding arm 33 for holding each substrate W is provided above the substrate transport robot 32 to be advaceable and retreatable.

A cassette support 42 is arranged along the second transfer path 31. A plurality of substrate cassettes 43 are placed on the cassette support 42. Each substrate cassette 43 stores a plurality of substrates W.

Exposure apparatuses 2a and 2b are arranged at opposite end portions of the second transfer path 31 of the substrate processing apparatus 1 respectively. The exposure apparatus 2a has a substrate transfer part 50a having three substrate support pins 51a. Similarly, the exposure apparatus 2b has a substrate transfer part 50b having three substrate support pins 51b. The substrate transfer part 50a of the exposure apparatus 2a is arranged adjacent to one end portion of the second transfer path 31, while the substrate transfer part 50b of the exposure apparatus 2b is arranged adjacent to the other end portion of the second transfer path 31.

An end portion of the second transfer path 31 defines a transfer port A for transferring and receiving each substrate W to and from the exposure apparatus 2a, while the other end portion of the second transfer path 31 defines a transfer port B for transferring and receiving each substrate W to and from the exposure apparatus 2b.

The exposure apparatus 2a comprises an exposure part for exposing each substrate W, an alignment mechanism for positioning each substrate W in the exposure part for printing an exposure pattern thereon, and a substrate transport robot for transferring each substrate between the exposure part and the substrate transfer part 50a. Similarly, the exposure apparatus 2b comprises an exposure part, an alignment mechanism, and a substrate transport robot for transferring each substrate W between the exposure part and the substrate transfer part 50b.

The substrate transport robot 22 of the first substrate transfer unit 20 transfers each substrate W through the first transfer path 21, introduces and discharges each substrate W into and from substrate processing units such as any of the spin coating units 10a and any of the spin developing units 10b, and transfers and receives each substrate W to and from the substrate transport robot 32 of the second substrate transfer unit 30.

The substrate transport robot 32 of the second substrate transfer unit 30 transfers each substrate W through the second transfer path 31, transfers and receives each substrate W to and from the substrate transport robot 22 of the first substrate transfer unit 20, introduces and discharges each substrate W into and from either substrate transfer part 50a or 50b of either exposure apparatus 2a or 2b, and stores and takes out each substrate W in and from any of the substrate cassettes 43. The second substrate transfer unit 30 is called an indexer/interface unit.

As shown in FIG. 5, the substrate transport robot 32 includes a substrate holding arm 33, a movable body 34, a support 35 and a base 36. Guide rails 40 extending in the Y-axis direction are fixed to the second transfer path 31. The base 36 is guided in the guide rails 40 to be movable in the Y-axis direction. This base 36 is driven in the Y-axis direction by a Y direction moving mechanism (not shown) formed by a ball screw 41 (see FIG. 4) arranged in the Y-axis direction, a motor and the like.

The support 35 is provided on the base 36 to be movable in the Z-axis direction (along arrow Z). This support 35 is driven in the Z-axis direction by a Z direction moving mechanism (not shown) formed by a ball screw, a motor and the like. The movable body 34 is provided on the support 35 to be rotatable in the θ-axis direction (rotational direction about a vertical axis). This movable body 34 is rotated/driven by a θ direction moving mechanism (not shown) formed by a motor and the like.

The substrate holding arm 33 has a horizontally slidable holding member 37, for holding each substrate W in a horizontal state. This substrate holding arm 33 is provided on the movable body 34 to be advanceable and retreatable in the X-axis direction in a horizontal plane by a horizontal direction moving mechanism formed by a motor (not shown), a pulley 38, a belt 39 and the like.

An exemplary operation of the substrate processing apparatus 1 according to the first embodiment of the present invention is now described.

The substrate transport robot 32 of the second substrate transfer unit 30 takes out each substrate W stored in each substrate cassette 43. In this case, the substrate holding arm 33 is moved in the Y- and Z-axis directions through the base 36, the support 35 and the movable body 34 and rotated in the θ-axis direction, to be positioned in front of any substrate cassette 43. The substrate holding arm 33 advances in the X-axis direction to be moved under a prescribed substrate W and thereafter raised to hold this substrate W, and retreats in the X-axis direction.

The substrate transport robot 32 transfers the substrate W held by the substrate holding arm 33 to the substrate transport robot 22 of the first substrate transfer unit 20. In this case, the substrate holding arm 33 is moved in the Y- and Z-axis directions and rotated in the 0-axis direction through the base 36, the support 35 and the movable body 34, to be positioned in front of the substrate holding arm 23 of the substrate transport robot 22. The substrate holding arm 23 advances in the X-axis direction to be moved under the substrate W held by the substrate holding arm 33, and thereafter raised for holding the substrate W, and retreats in the X-axis direction. Thus, the substrate transport robot 22 receives the substrate W.

The substrate transport robot 22 of the first substrate transfer unit 20 introduces the substrate W held by the substrate holding arm 23 into any spin coating unit 10a. Thereafter this substrate transport robot 22 discharges the substrate W coated with a resist from the spin coating unit 10a, and transfers the same to the substrate transport robot 32 of the second substrate transfer unit 30.

The substrate transport robot 32 transfers the substrate W to the transfer port A through the second transfer path 31, and places the same on the substrate support pins 51a of the substrate transfer part 50a of the exposure apparatus 2a. Thereafter the substrate transport robot of the exposure apparatus 2a transfers the substrate W placed on the substrate transfer part 50a to the exposure part.

The substrate transport robot 22 of the first substrate transfer unit 20 discharges another substrate W coated with the resist from the spin coating unit 10a, and transfers the same to the substrate transport robot 32 of the second substrate transfer unit 30. The substrate transport robot 32 transfers this substrate W to the transfer port B through the second transfer path 31, and places the same on the substrate support pins 51b of the substrate transfer part 50b of the exposure apparatus 2b. Thereafter the substrate transport robot of the exposure apparatus 2b transfers the substrate W placed on the substrate transfer part 50b to the exposure part.

On the other hand, the substrate W exposed by the exposure apparatus 2a is placed on the substrate transfer part 50a by the substrate transport robot. The substrate transport robot 32 of the second substrate transfer unit 30 takes out the substrate W placed on the substrate transfer part 50a from the transfer port A for transfering the same, and transfers the same to the substrate transport robot 22 of the first substrate transfer unit 20. The substrate transport robot 22 of the first substrate transfer unit 20 introduces the substrate W into any spin developing unit 10b.

The substrate W exposed by the exposure part of the exposure apparatus 2b is placed on the substrate transfer part 50b by the substrate transport robot. The substrate transport robot 32 of the second substrate transfer unit 30 takes out the substrate W placed on the substrate transfer part 50b from the transfer port B for transfering the same, and transfers the same to the substrate transport robot 22 of the first substrate transfer unit 20. The substrate transport robot 22 of the first substrate transfer unit 20 introduces this substrate W into another spin developing unit 10b.

The substrates W completely processed in the substrate processing apparatus 1 are transferred from the substrate transport robot 22 of the first substrate transfer unit 20 to the substrate transport robot 32 of the second substrate transfer unit 30, and stored in any substrate cassette 43.

In the substrate processing apparatus 1 according to the first embodiment of the present invention, the substrates W processed in each spin coating unit 10a are distributed to the two exposure apparatuses 2a and 2b, whereby reduction of the operational efficiency of the substrate processing apparatus 1 resulting from incoincidence in throughput between the substrate processing apparatus 1 and the exposure apparatuses 2a and 2b can he avoided or relieved.

Particularly when the time required for exposing the substrate W in each of exposure apparatuses 2a and 2b is twice that required for processing the substrate W in each rotary coating unit 10a, absolutely no waste is caused in operation of the substrate processing apparatus 1.

Further, external apparatuses such as the exposure apparatuses 2a and 2b can be provided on both sides of the substrate processing apparatus 1, whereby layout flexibility is increased. Consequently, it is possible to reduce a dead space in a clean room.

Figure 1:
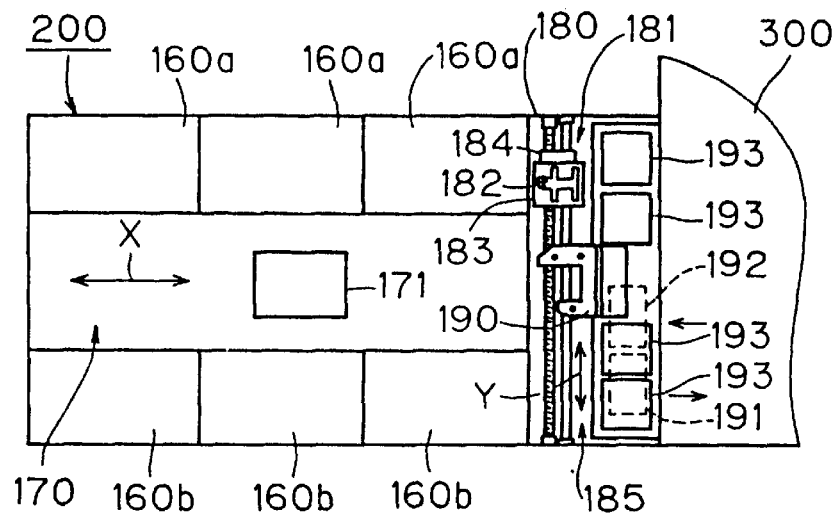
FIG. 1 is a plan view of a conventional substrate processing apparatus comprising an interface unit.
Figure 2:
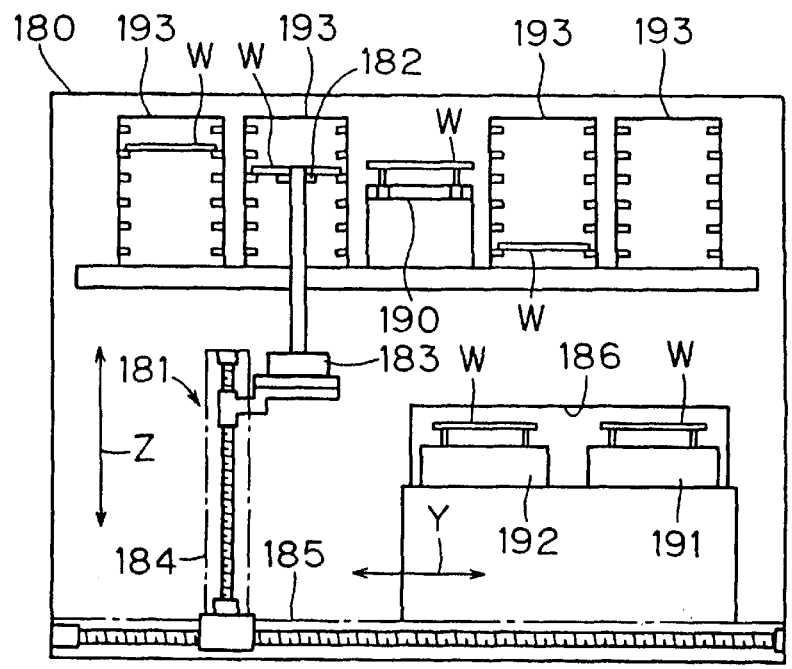
FIG. 2 is a front elevational view of the interface unit in the substrate processing apparatus shown in FIG. 1.
Figure 3:
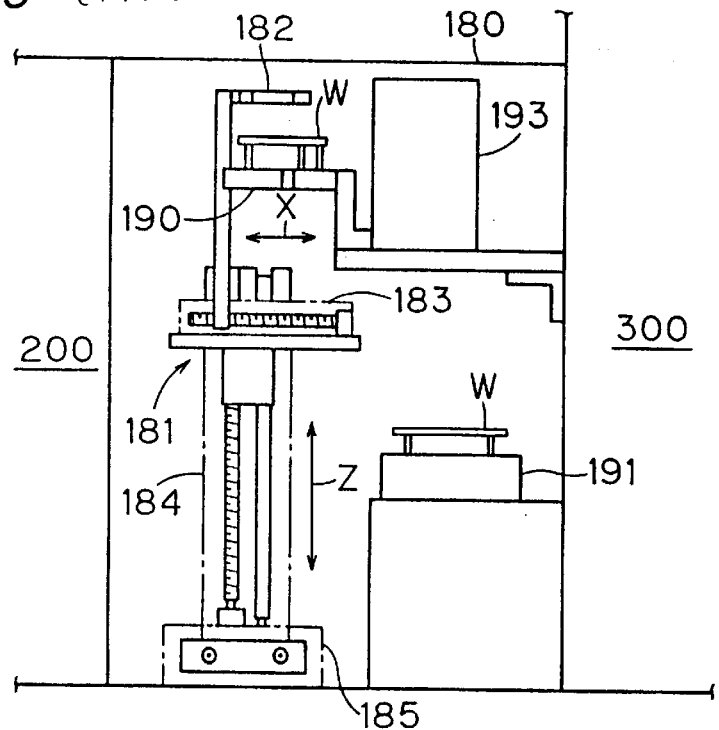
FIG. 3 is a side elevational view of the interface unit in the substrate processing apparatus shown in FIG. 1.

While the substrate transport robot 32 of the second substrate transfer unit 30 of the substrate processing apparatus 1 introduces and discharges the substrates W into and from the substrate transfer parts 50a and 50b in the exposure apparatuses 2a and 2b in the first embodiment of the present invention, substrate transfer parts or the substrate introduction table 191 and the substrate discharge table 192 shown in FIG. 2 are provided on each end portion of the second transfer path 31 of the substrate processing apparatus 1 if the substrate transport robots of the exposure apparatuses 2a and 2b have functions of introducing and discharging the substrates W into and from the substrate processing apparatus 1.

Figure 6:
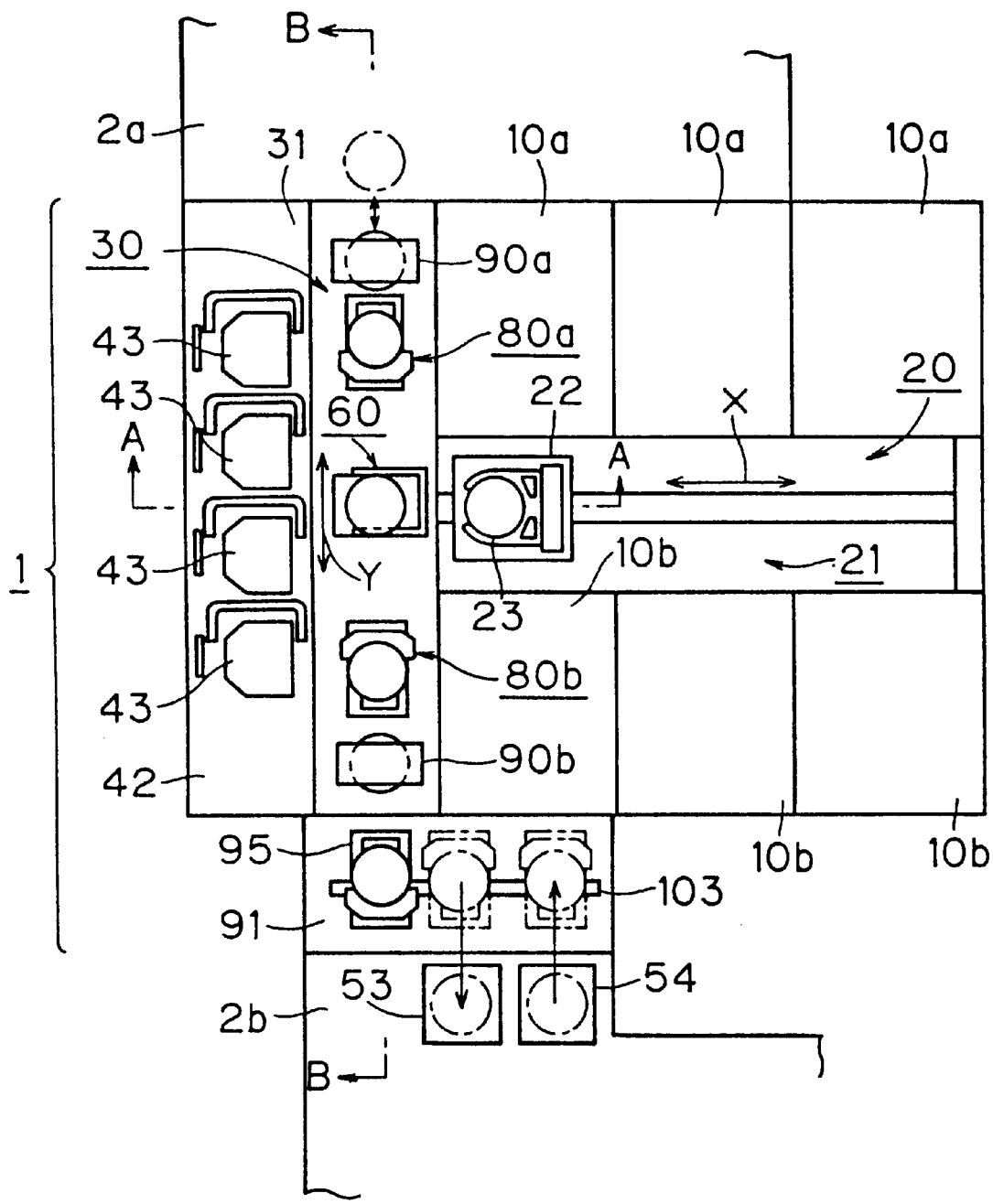
FIG. 6 is a plan view of a substrate processing apparatus according to a second embodiment of the present invention.
Figure 7:
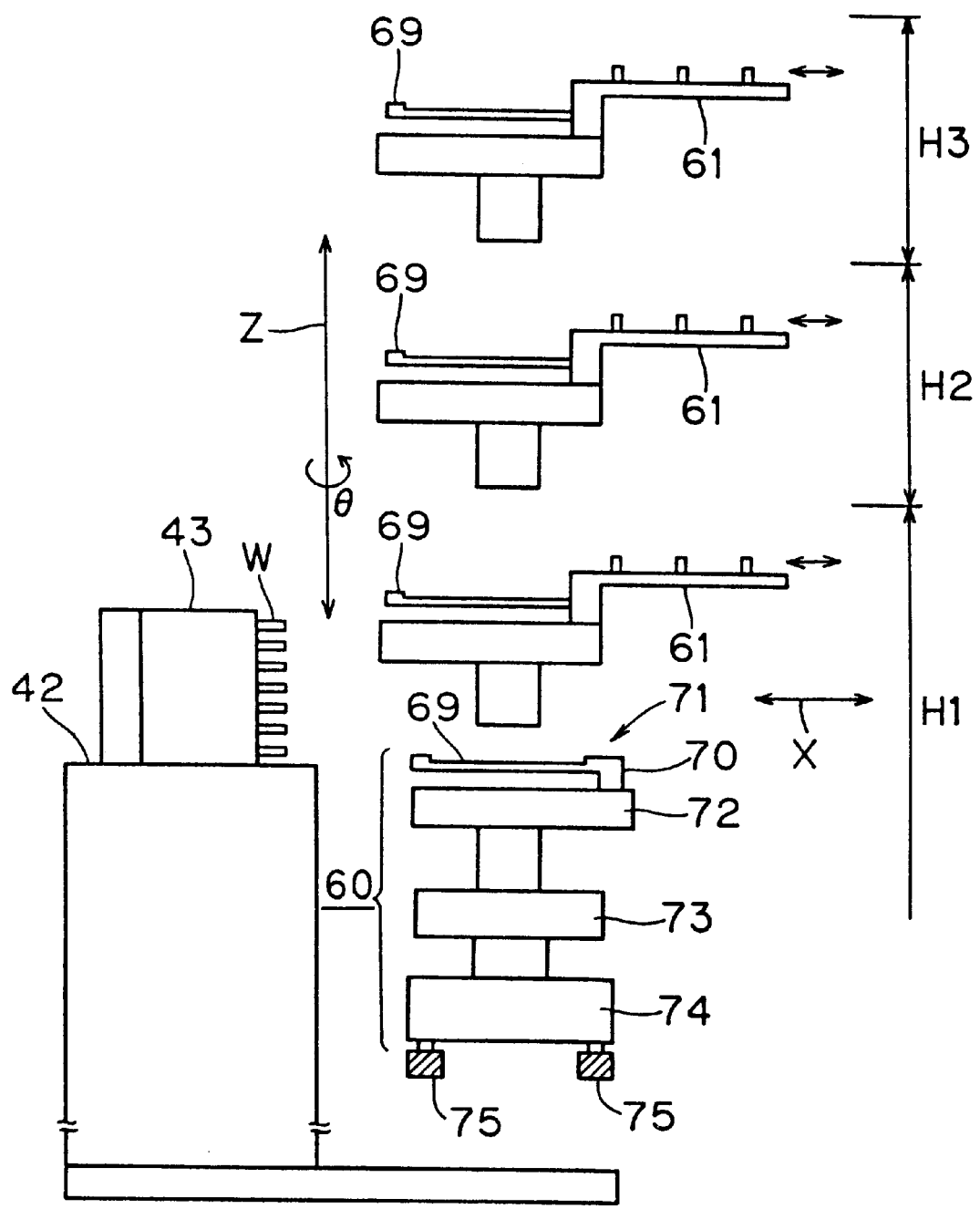
FIG. 7 is a sectional view taken along the line A—A in FIG. 6.
Figure 8:
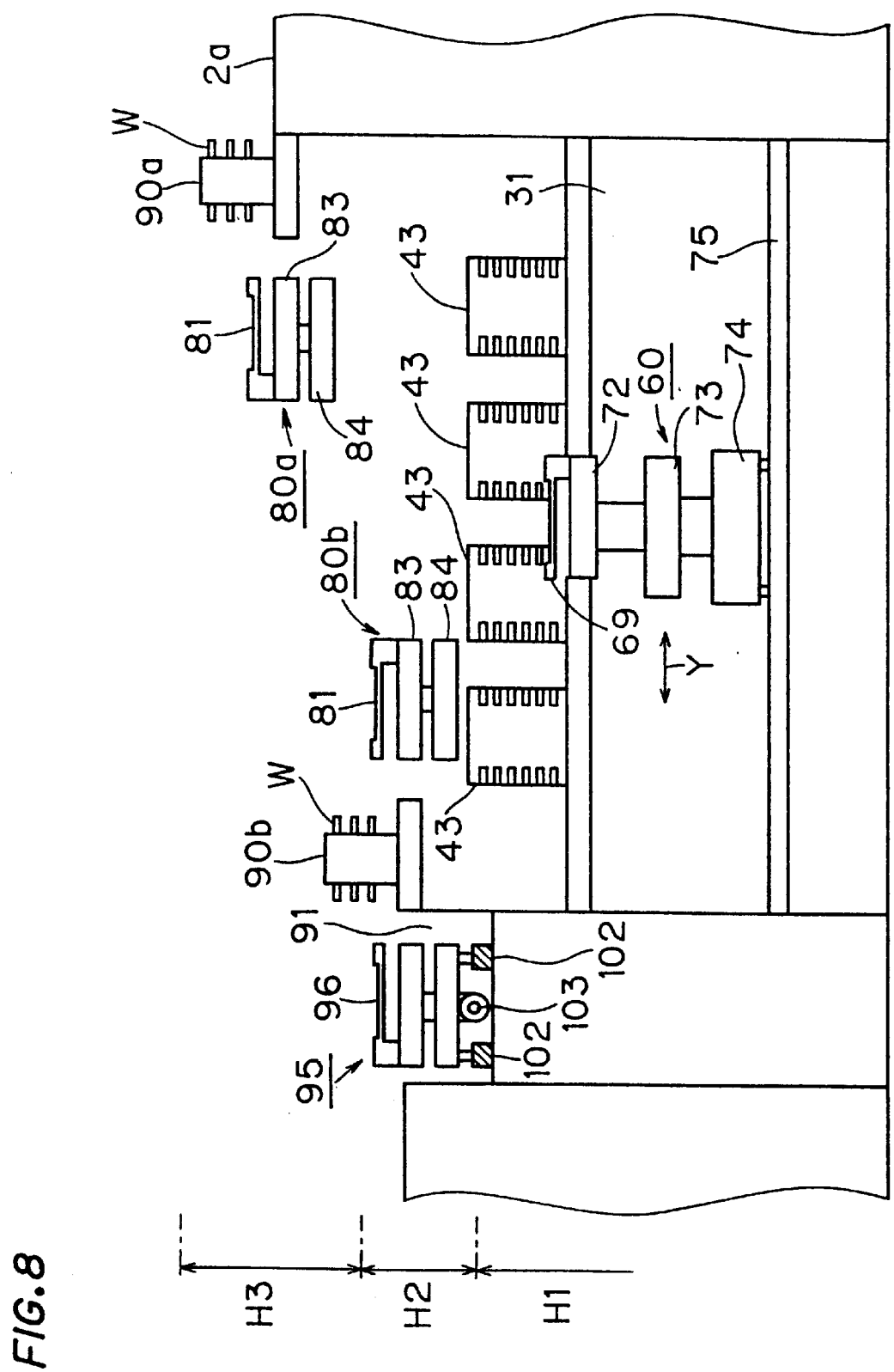
FIG. 8 is a sectional view taken along the line B—B in FIG. 6.

FIG. 6 is a plan view of a substrate processing apparatus 1 according to a second embodiment of the present invention, and FIGS. 7 and 8 are sectional views taken along the lines A—A and B—B in FIG. 6 respectively.

The substrate processing apparatus 1 according to the second embodiment of the present invention has a second substrate transfer unit 30, which is different in structure from that of the substrate processing apparatus 1 according to the first embodiment of the present invention. Further, exposure apparatuses 2a and 2b arranged on both end portions of a second transfer path 31 have different substrate introduction/discharge systems. Namely, the exposure apparatus 2a has a mechanism of introducing and discharging each substrate W into and from the substrate processing apparatus 1. On the other hand, the exposure apparatus 2b has no mechanism of introducing and discharging each substrate W into and from the substrate processing apparatus 1, but is provided with a substrate receiving part 53 and a substrate transfer part 54 for receiving and transferring each substrate W respectively.

Referring to FIGS. 6 to 8, parts identical in structure to those of the first embodiment shown in FIGS. 4 and 5 are denoted by the same reference numerals, to omit redundant description.

Referring to FIGS. 6 to 8, the second substrate transfer unit 30 has the second transfer path 31 extending in the Y-axis direction on one end portion of a first transfer path 21 of a first substrate transfer unit 20. The second transfer path 31 is provided with a first substrate transport robot 60, a pair of second substrate transport robots 80a and 80b, and a pair of substrate holding parts 90a and 90b.

The first substrate transport robot 60 includes a substrate holding part 71, a movable body 72, a support 73 and a base 74. Guide rails 75 extending in the Y-axis direction are fixed to the second transfer path 31, and the base 74 is guided in these guide rails 75 to be movable in the Y-axis direction. The base 74 is driven in the Y-axis direction by a Y direction moving mechanism (not shown) formed by a ball screw arranged in the Y-axis direction, a motor and the like.

The support 73 is provided on the base 74 to be movable in the Z-axis direction. This support 73 is driven in the Z-axis direction by a Z direction moving mechanism (not shown) formed by a motor and the like.

The movable body 72 is provided on the support 73 to be movable in the θ-axis direction. This movable body 72 is rotated/driven by a θ direction moving mechanism (not shown) formed by a motor and the like.

Figure 9:
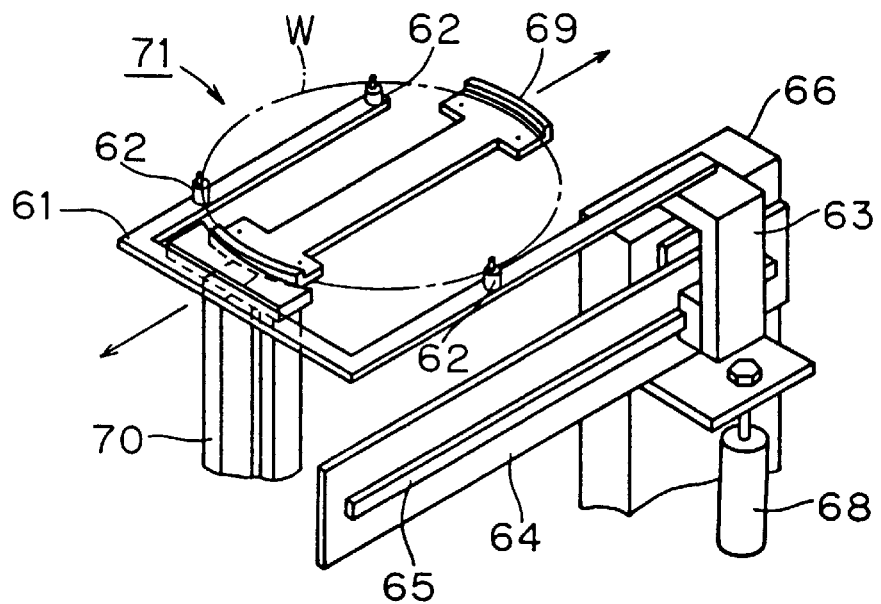
FIG. 9 is a perspective view of a substrate holding part of a first substrate transport robot.
Figure 10:
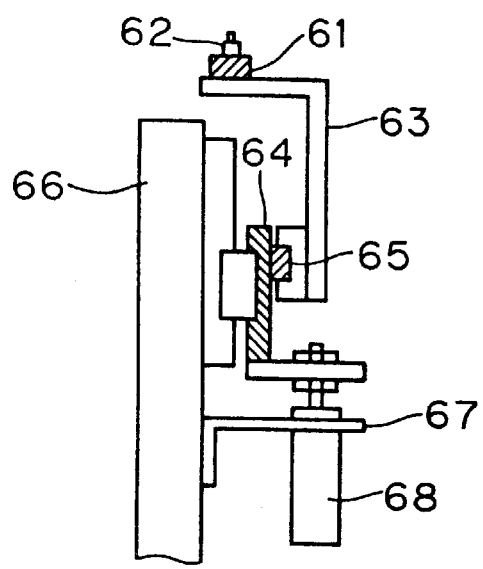
FIG. 10 is a sectional view of the substrate holding part shown in FIG. 9.

FIG. 9 is a perspective view showing the substrate holding part 71 of the first substrate transport robot 60, and FIG. 10 is a sectional view of the substrate holding part 71 shown in FIG. 9. The substrate holding part 71 of the first substrate transport robot 60 comprises a substrate support frame 61 and a substrate holding arm 69 which are movable while supporting each substrate W.

Three support pins 62 are arranged on an upper surface of the substrate support frame 61, for supporting an outer peripheral edge of each substrate W. The substrate support frame 61 engages with a horizontally extending guide rail 65 through a coupling part 63, and horizontally slides along the guide rail 65 by a horizontal driving mechanism (not shown). The guide rail 65 is formed on a guide member 64, which in turn is vertically movably mounted on a support 66. A lower portion of the guide member 64 is coupled to a rod of a cylinder 68 which is fixed to the support 66. When the rod of the cylinder 68 expands/contracts, therefore, the guide member 64 is vertically moved thereby vertically moving the substrate support frame 61.

The substrate holding arm 69 is formed to be capable of holding both diametral end portions of each substrate W, and an end portion thereof is coupled to the movable body 72 through a support 70. The support 70 supporting the substrate holding arm 69 is formed to be horizontally movable by a horizontal moving mechanism (not shown) provided on the movable body 72.

The substrate holding arm 69 slides oppositely to the movement of the substrate support frame 61. The substrate support frame 61 is employed for transferring and receiving each substrate W to and from the second substrate transport robots 80a and 80b and the substrate transport robot 22 of the first substrate transfer unit 20, while the substrate holding arm 69 is employed for transferring and receiving each substrate W to and from any substrate cassette 43. Each substrate W can be transferred between the substrate support frame 61 and the substrate holding arm 69 by vertically moving the substrate support frame 61.

The second substrate transport robots 80a and 80b are arranged on both sides of the first substrate transport robot 60 in the Y-axis direction of the second transfer path 31. The two second substrate transport robots 80a and 80b are identical in structure to each other. Therefore, the second substrate transport robot 80a is now described.

Figure 11:
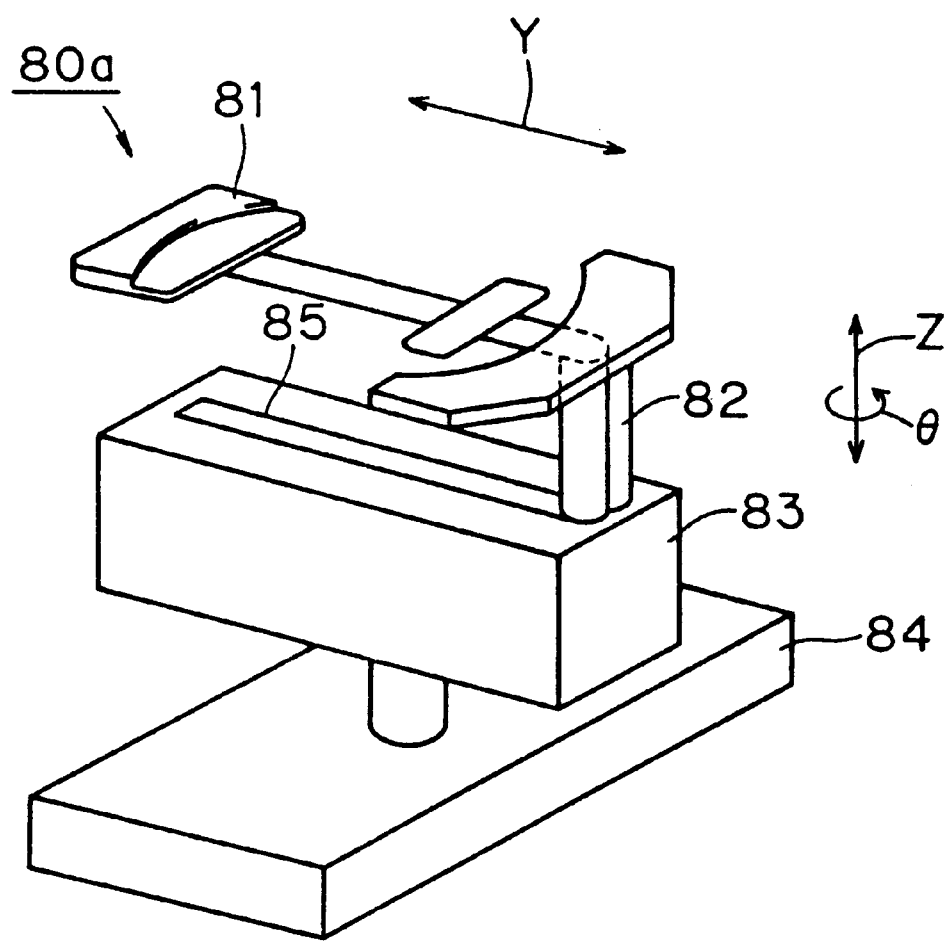
FIG. 11 is a perspective view of a second substrate transport robot.

The second substrate transport robot 80a is fixed with respect to the Y-axis direction. FIG. 11 is a perspective view of the second substrate transport robot 80a. The second substrate transport robot 80a comprises a substrate holding arm 81 for holding each substrate W. The substrate holding arm 81 is mounted on an upper end of a support 82 extending from that of a movable body 83. A lower portion of the support 82 is coupled to a horizontal moving mechanism (not shown) formed by a motor, pulley, a driving belt and the like provided in the movable body 83, and provided to be movable along a groove 85 in the upper surface of the movable body 83. The movable body 83 is provided to be vertically movable and rotatable about a vertical axis with respect to a base 84 fixed to a prescribed position of the second transfer path 31. Thus, each substrate W supported by the substrate holding arm 81 can be moved in the Y-, Z- and θ-axis directions.

The substrate holding parts 90a and 90b are arranged between the second substrate transport robots 80a and 80b and the exposure apparatuses 2a and 2b respectively. The substrate holding parts 90a and 90b, which are provided for temporarily holding the substrates W respectively, are formed by frame members having open ends, and provided therein with racks for supporting a plurality of substrates W.

A third transfer path 91 extending in the X-axis direction is provided on an end portion of the second transfer path 31 closer to the exposure apparatus 2b, and an external substrate transport robot 95 is provided on this third transfer path 91. The external substrate transport robot 95 transfers each substrate W between the substrate holding part 90b and the substrate receiving part 53 and the substrate transfer part 54 of the exposure apparatus 2b.

Figure 12:
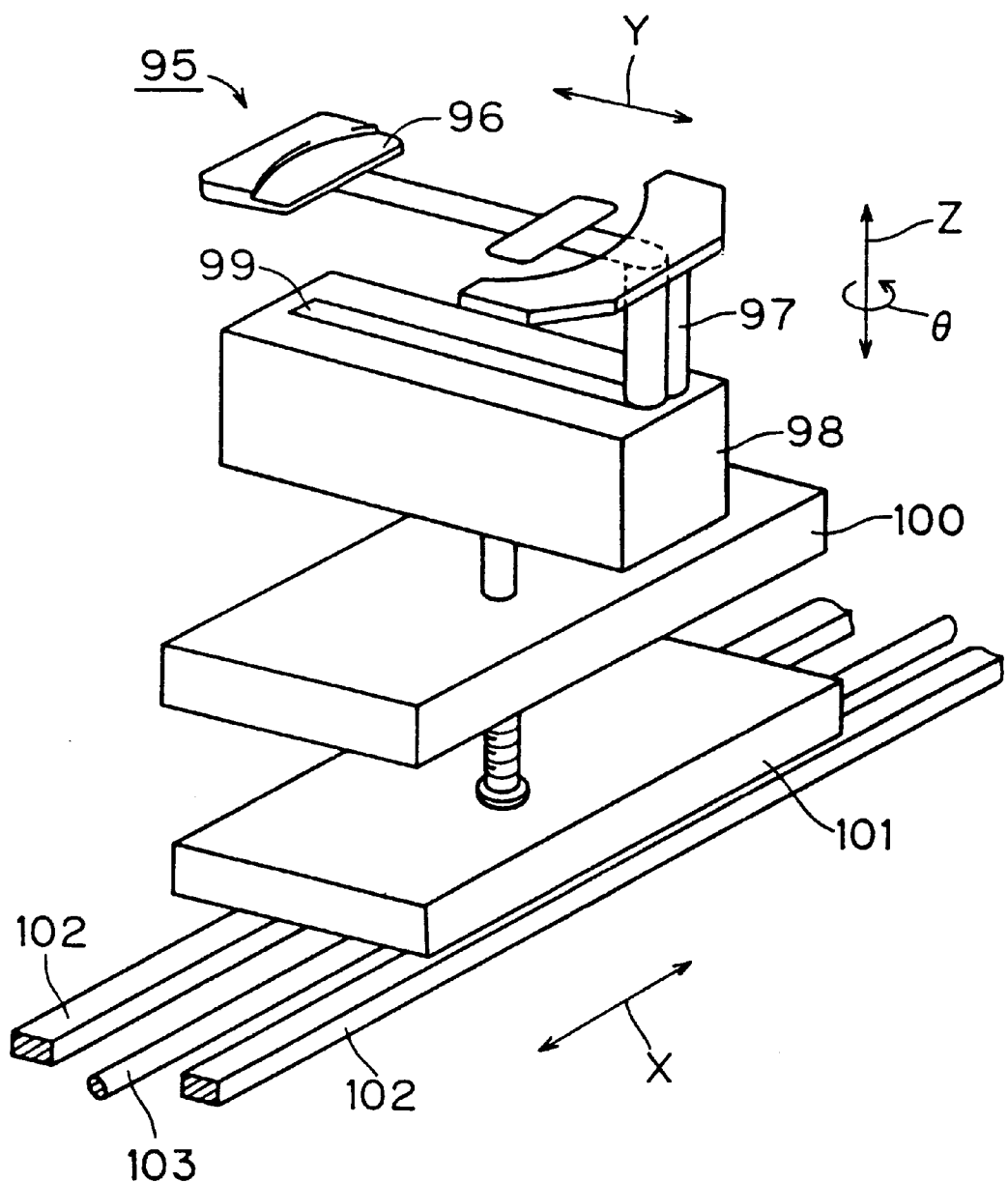
FIG. 12 is a perspective view of an external substrate transport robot.

FIG. 12 is a perspective view showing the structure of the external substrate transport robot 95. The external substrate transport robot 95 includes a substrate holding arm 96, a movable body 98, a support 100 and a base 101. Guide rails 102 extending in the X-axis direction and a ball screw 103 are fixed to the third transfer path 91. The base 101 engages with the guide rails 102, and is driven by an X direction moving mechanism (not shown) formed by the ball screw 103 arranged in the X-axis direction, a motor and the like, to be guided in the X-axis direction by the guide rails 102.

The support 100 is provided on the base 101 to be movable in the Z-axis direction. This support 100 is driven in the Z-axis direction by a Z direction moving mechanism (not shown) formed by a ball screw, a motor and the like.

The movable body 98 is provided on the support 100 to be rotatable in the θ-axis direction. This movable body 98 is rotated by a θ direction moving mechanism (not shown) formed by a motor and the like.

The substrate holding arm 96 is connected to an upper end of a support 97 extending from an upper surface of the movable body 98. A lower portion of the support 97 is connected to a horizontal moving mechanism (not shown) provided in the movable body 98. The horizontal moving mechanism is formed by a motor, a pulley, a driving belt and the like, for sliding the support 97 in the horizontal direction (Y-axis direction) along a groove 99.

In the substrate processing apparatus 1 having the aforementioned structure, the first substrate transport robot 60 accesses each substrate cassette 43, the pair of second substrate transport robots 80a and 80b and the substrate transport robot 22 of the first substrate transfer unit 20 respectively, for transferring and receiving each substrate W to and from the same.

The second substrate transport robot 80a transfers each substrate W between the first substrate transport robot 60 and the substrate holding part 90a. The second substrate transport robot 80b transfers each substrate W between the first substrate transport robot 60 and the substrate holding part 90b. Further, the substrate holding part 90a temporarily holds each substrate W transferred between the second substrate transport robot 80a and the exposure apparatus 2a, while the substrate holding part 90b temporarily holds each substrate W transferred between the second substrate transport robot 80b and the external substrate transport robot 95.

The external substrate transport robot 95 transfers each substrate W held by the substrate holding part 90b to the substrate receiving part 53 of the exposure apparatus 2b, and receives each substrate W from the substrate transfer part 54 of the exposure apparatus 2b, for making the substrate holding part 90b hold the same.

In the second transfer path 31 of the second substrate transfer unit 30, first, second and third levels H1, H2 and H3 are formed from below in the Z-axis direction, as shown in FIGS. 7 and 8. The second substrate transport robots 80b and 80a are arranged in the second and third levels H2 and H3 respectively. The first substrate transport robot 60 takes out and stores each substrate W from and in each substrate cassette 43 in the first level H1, and transfers and receives each substrate W to and from the substrate transport robot 22 of the first substrate transfer unit 20 in the first level H1.

The first substrate transport robot 60 transfers and transfers each substrate W between the substrate transport robot 22 of the first substrate transfer unit 20 and the second substrate transport robot 80b in the second level H2. Further, the first substrate transport robot 60 transfers and transfers each substrate W between the substrate transport robot 22 of the first substrate transfer unit 20 and the second substrate transport robot 80a in the third level H2.

Each substrate cassette 43 is arranged on a vertical position substantially equal to that of the first level H1 under the second level H2. Therefore, the first substrate transport robot 60 passes and moves under the second substrate transport robots 80a and 80b, and can access each substrate cassette 43 under the second substrate transport robots 80a and 80b.

An exemplary operation of the substrate processing apparatus 1 according to the second embodiment of the present invention is now described with reference to FIGS. 6 to 12.

The first substrate transport robot 60 of the second substrate transfer unit 30 takes out each substrate W stored in each substrate cassette 43. In this case, the substrate holding arm 69 of the first substrate transport robot 60 is moved in the Y- and Z-axis directions and rotated in the θ-axis direction through the base 74, the support 73 and the movable body 72, to be positioned in front of any substrate cassette 43. Further, the substrate holding arm 69 advances in the X-axis direction to be moved under a prescribed substrate W in this substrate cassette 43, and thereafter raised for holding the substrate W and retreating in the X-axis direction.

The first substrate transport robot 60 transfers the substrate W taken out from the substrate cassette 43 to the substrate transport robot 22 of the first substrate transfer unit 20. In this case, the first substrate transport robot 60 is moved in the Y- and Z-axis directions and rotated in the θ-axis direction through the base 74, the support 73 and the movable body 72, to be positioned in front of the substrate holding arm 23 of the substrate transport robot 22. The substrate W held by the substrate holding arm 69 is transferred to the substrate support frame 61, which in turn advances in the X-axis direction so that the substrate holding arm 23 of the substrate transport robot 22 is moved under the substrate support frame 61. Further, the substrate holding arm 23 is raised to hold the substrate W, and retreats in the X-axis direction. Thus, the substrate transport robot 22 receives the substrate W.

The substrate transport robot 22 of the first substrate transfer unit 20 introduces the substrate W held by the substrate holding arm 23 into any spin coating unit 10*a*. Thereafter the substrate transport robot 22 discharges the substrate W coated with a resist from this spin coating unit 10a, and transfers the same to the first substrate transport robot 60 of the second substrate transfer unit 30. The operation of transferring the substrate W from the substrate transport robot 22 to the first substrate transport robot 60 is performed in a procedure opposite to that of the aforementioned operation of transferring the substrate W from the first substrate transport robot 60 to the substrate transport robot 22. This transfer of the substrate W is performed in the third level H3 when the same is transfered to the exposure apparatus 2*a,* or performed in the second level H2 when the same is transfered to the exposure apparatus 2*b.*

The first substrate transport robot 60 moves through the second transfer path 31 in the Y-axis direction while holding the substrate W received from the substrate transport robot 22, and transfers the same to the second substrate transport robot 80*a* in the third level H3. In this case, the first substrate transport robot 60 moves while holding the substrate W in the substrate holding arm 69, and is positioned in front of the substrate holding arm 81 of the second substrate transport robot 80*a*. The substrate W is transferred from the substrate holding arm 69 to the substrate support frame 61, which in turn advances in the Y-axis direction. The second substrate transport robot 80*a* moves the substrate holding arm 81 under the substrate W supported by the substrate support frame 61, is thereafter raised to receive the substrate W from the substrate support frame 61, and retreats in the Y-axis direction. Thus, the substrate W is transferred from the substrate support frame 61 of the first substrate transport robot 60 to the second substrate transport robot 80*a*.

The substrate holding arm 81 of the second substrate transport robot 80*a* rotates in the θ-axis direction, advances toward the substrate holding part 90*a* for placing the substrate W on any rack of the substrate holding part 90*a,* and retreats.

The exposure apparatus 2*a* fetches the prescribed substrate W from the substrate holding part 90*a* by the substrate transfer mechanism provided therein, and exposes the same by the exposure part.

The substrate W exposed by the exposure part of the exposure apparatus 2*a* is placed on the substrate holding part 90*a* again. The second substrate transport robot 80*a* receives the exposed substrate W from the substrate holding part 90*a* by the substrate holding arm 81. The second substrate transport robot 80*a* performs an operation reverse to the above with the first substrate transport robot 60, for transferring the substrate W to the substrate support frame 61 of the first substrate transport robot 60.

The first substrate transport robot 60 moves through the second transfer path 31, and transfers the exposed substrate W to the substrate transport robot 22 of the first substrate transfer unit 20 in the third level H3. In this case, the first substrate transport robot 60 transfers the substrate W from the substrate holding arm 69 to the substrate support frame 61, and advances in the X-axis direction for transferring the substrate W from the substrate support frame 61 of the first substrate transport robot 60 to the substrate holding arm 23 of the substrate transport robot 22. The substrate transport robot 22 of the first substrate transfer unit 20 introduces the received substrate W in any spin developing unit 10*b*.

In case of transfering another substrate W coated with the resist by the spin coating unit 10*a* to the exposure apparatus 2*b,* on the other hand, the first substrate transport robot 60 holds the substrate W received from the substrate transport robot 22 of the substrate transfer unit 20, moves in the Y-axis direction through the second transfer path 31, and transfers the substrate W to the second substrate transport robot 80*b* in the second level H2. In this case, the first substrate transport robot 60 moves while holding the substrate W in the substrate holding arm 69, and is positioned in front of the substrate holding arm 81 of the second substrate transport robot 80*b*. The first substrate transport robot 60 transfers the substrate W from the substrate holding arm 69 to the substrate support frame 61, and thereafter advances the substrate support frame 61 in the Y-axis direction. The second substrate transport robot 80*b* moves the substrate holding arm 81 under the substrate W supported by the substrate support frame 61, is thereafter raised to receive the substrate W from the substrate support frame 61, and retreats in the Y-axis direction. Thus, the substrate W is transferred from the first substrate transport robot 60 to the second substrate transport robot 80*b*.

The substrate holding arm 81 of the second substrate transport robot 80*b* rotates in the θ-axis direction, further advances toward the substrate holding part 90*b,* places the substrate W in any rack of the substrate holding part 90*b* and retreats.

The external substrate transport robot 95 moves through the third transfer path 91 in the X-axis direction, and is positioned in front of the substrate holding part 90*b*. The substrate holding arm 96 of the external substrate transport robot 95 advances in the Y-axis direction, moves under the prescribed substrate W, is thereafter raised to hold the substrate W, and retreats in the Y-axis direction.

Further, the external substrate transport robot 95 moves through the third transfer path 91 while holding the substrate W, and is positioned in front of the substrate receiving part 53 of the exposure apparatus 2*b*. The substrate holding arm 96 of the external substrate transport robot 95 advances in the Y-axis direction and transfers the substrate W to the substrate receiving part 53. Thereafter the substrate holding arm 96 of the external substrate transport robot 95 retracts in the Y-axis direction.

The substrate W exposed by the exposure part of the exposure apparatus 2*b* is transferred from the substrate transfer part 54 to the external substrate transport robot 95, and transferred to the substrate holding part 90*b* by the external substrate transport robot 95. The second substrate transport robot 80b receives the exposed substrate W from the substrate holding part 90b. The first substrate transport robot 60 moves through the second transfer path 31, and is positioned in front of the substrate holding arm 81 of the second substrate transport robot 80b. The first substrate transport robot 60 advances the substrate support frame 61 under the substrate W and is raised for receiving the substrate W from the substrate holding arm 81 on the substrate support frame 61.

The first substrate transport robot 60 transfers the substrate W from the substrate support frame 61 to the substrate holding arm 69, thereafter moves through the second transfer path 31 while holding the substrate W, and is positioned in front of the substrate transport robot 22 of the first substrate transfer unit 20. The first substrate transport robot 60 transfers the substrate W from the substrate holding arm 69 to the substrate support frame 61, and thereafter transfers the substrate W from the substrate support frame 61 to the substrate holding arm 23 of the substrate transport robot 22 in the second level H2.

The substrate transport robot 22 of the first substrate transfer unit 20 introduces the received substrate W into another spin developing unit 10b.

The substrates W completely processed in the substrate processing apparatus 1 are transferred from the substrate transport robot 22 of the first substrate transfer unit 20 to the first substrate transport robot 60 of the second substrate transfer unit 30 in the first level H1, and stored in any substrate cassette 43.

In the substrate processing apparatus 1 according to the second embodiment of the present invention, substrates processed in each spin coating units 10a are distributed into the two exposure apparatuses 2a and 2b similarly to the substrate processing apparatus 1 according to the first embodiment of the present invention, whereby reduction of the operational efficiency caused by inconsistence in throughput of the substrate processing apparatus 1 and the exposure apparatuses 2a and 2b can be avoided or relieved. Further, external apparatuses such as the exposure apparatuses 2a and 2b can be set on both sides of the substrate processing apparatus 1, whereby layout flexibility is increased. Consequently, a dead space in a clean room can be reduced.

In the second embodiment of the present invention, further, the substrate holding parts 90a and 90b capable of temporarily holding a plurality of substrates W are arranged on the substrate transfer parts 50a and 50b for the exposure apparatuses 2a and 2b, whereby adjustment of inconsistency in throughput of the exposure apparatuses 2a and 2b and the substrate processing apparatus 1 can be simplified and waste times of substrate processes can be eliminated.

In addition, the moving distance of the first substrate transport robot 60 is reduced due to provision of the pair of second substrate transport robots 80a and 80b, and transfer efficiency of the first substrate transport robot 60 for the substrates W can be increased.

Further, the first substrate transport robot 60 and the pair of second substrate transport robots 80a and 80b are arranged in the first to third levels H1 to H3 respectively, whereby the second transfer path 31 can be prevented from increase in plane occupied area, and the substrate processing apparatus 1 can be miniaturized.

Figure 13:
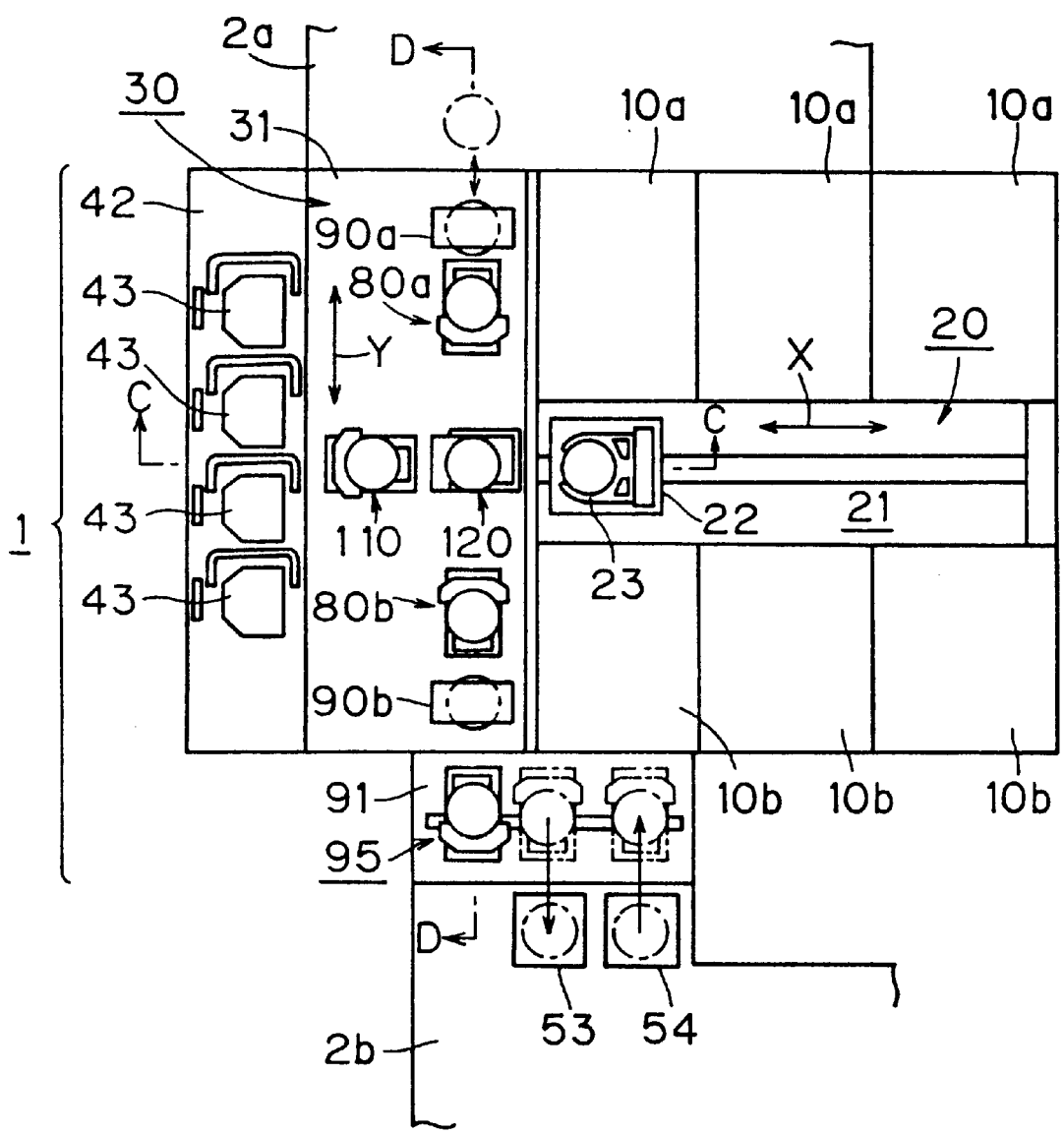
FIG. 13 is a plan view of a substrate processing apparatus according to a third embodiment of the present invention.
Figure 14:
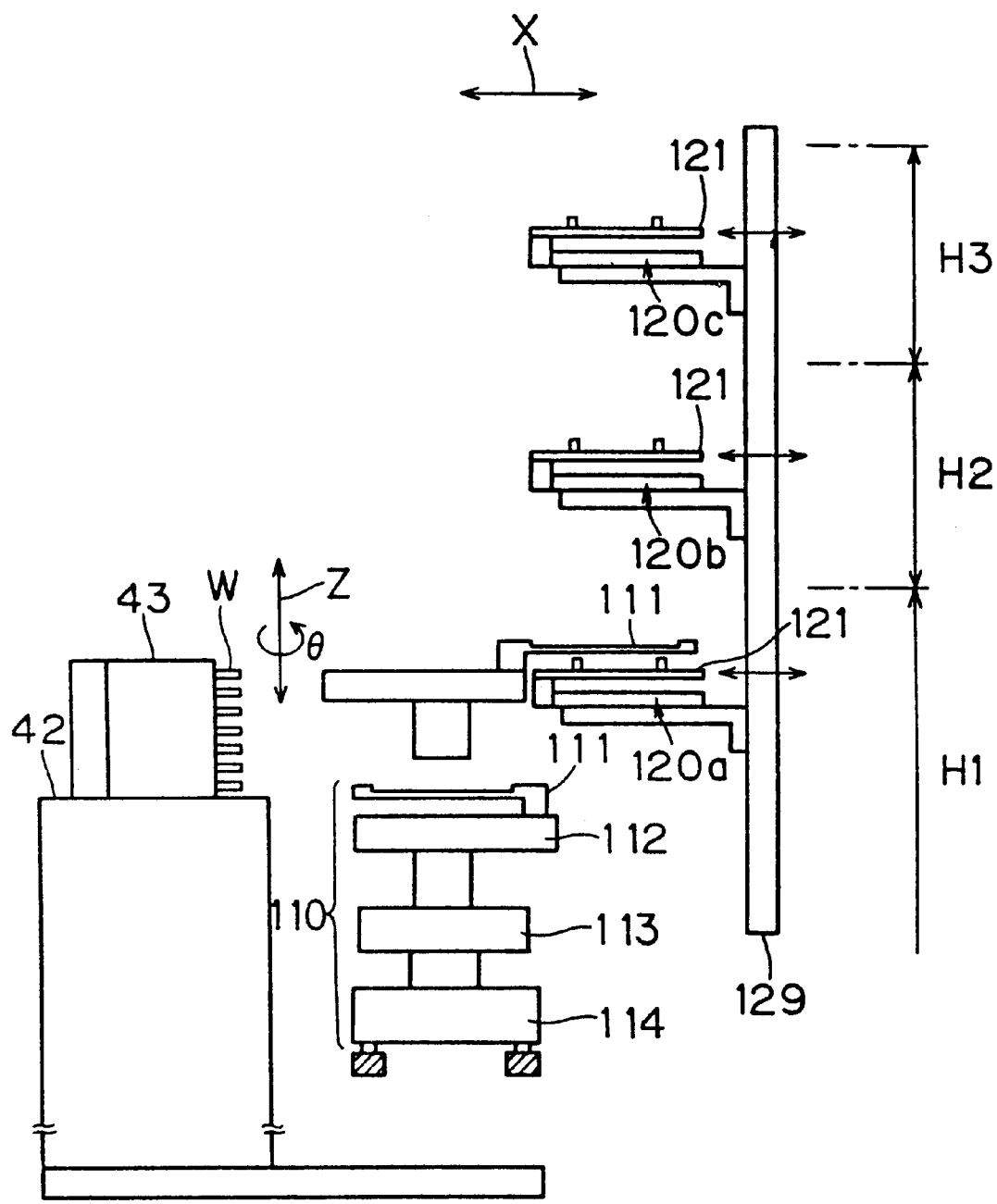
FIG. 14 is a sectional view taken along the line C—C in FIG. 13.
Figure 15:
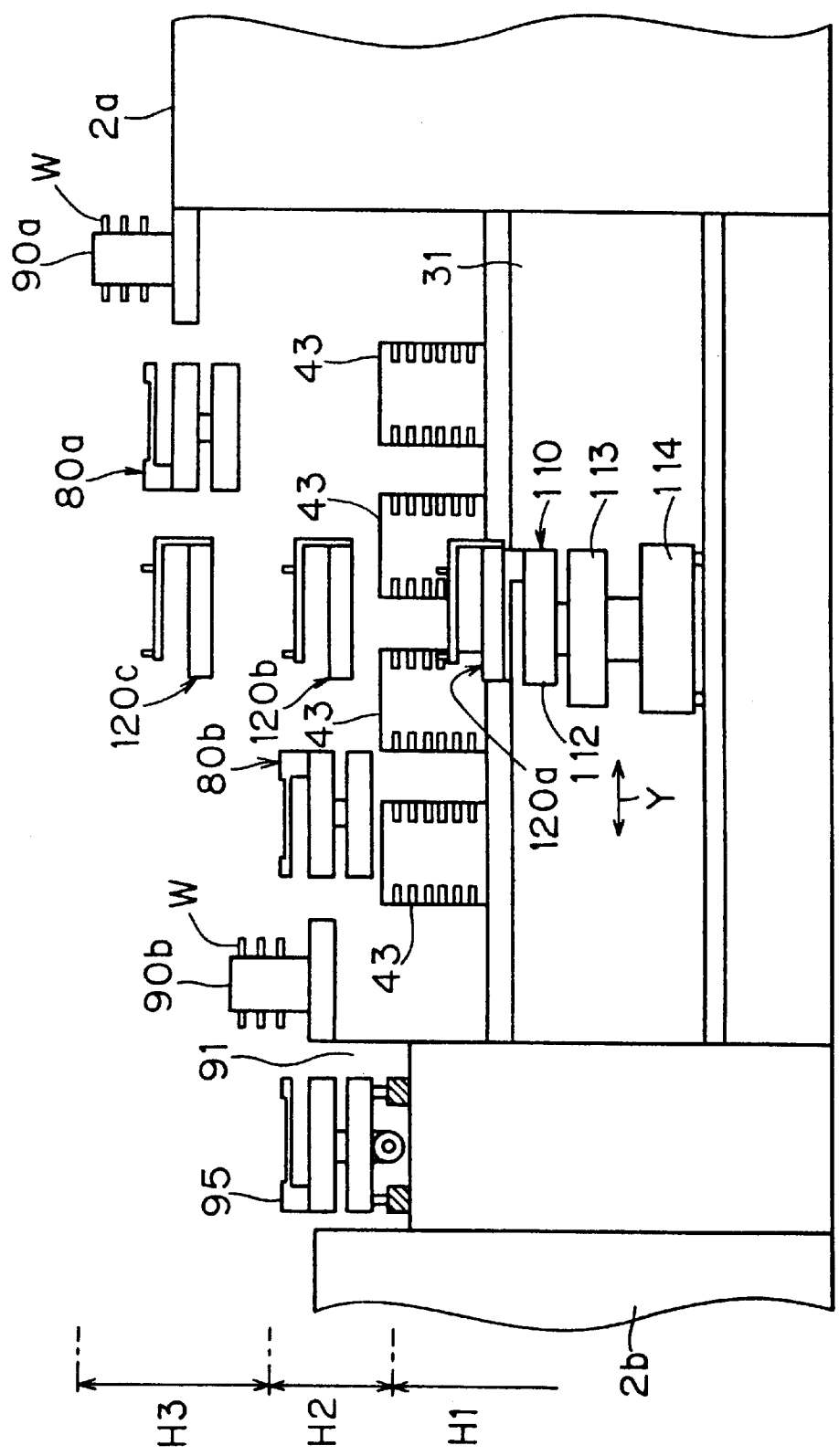
FIG. 15 is a sectional view taken along the line D—D in FIG. 13.

FIG. 13 is a plan view of a substrate processing apparatus 1 according to a third embodiment of the present invention, and FIGS. 14 and 15 are sectional views taken along the lines C—C and D—D in FIG. 13 respectively. The substrate processing apparatus 1 according to the third embodiment of the present invention is provided with a second substrate transfer unit 30 which is different in structure from that of the substrate processing apparatus 1 according to the second embodiment of the present invention. Referring to FIGS. 13 to 15, parts having the same structures as those in the second embodiment shown in FIGS. 6 to 8 are denoted by the same reference numerals, to omit redundant description.

Referring to FIGS. 13 to 15, the second substrate transfer unit 30 has a second transfer path 31 extending in the Y-axis direction on one end portion of a first transfer path 21 of a first substrate transfer unit 20. The second transfer path 31 is provided with a first substrate transport robot 110, a pair of second substrate transport robots 80a and 80b, a pair of substrate holding parts 90a and 90b, and three third substrate transport robots 120a to 120c.

Similarly to the first substrate transport robot 60 in the second embodiment shown in FIG. 9, the first substrate transport robot 110 includes a substrate holding part 111 comprising a substrate holding arm, a movable body 112, a support 113 and a base 114, and is formed to be capable of moving each substrate W in the X-, Y- and Z-axis directions and rotating the same about a vertical axis. The substrate holding part 111 is identical in structure to the substrate holding part 71 of the second embodiment shown in FIG. 9. In the following description, therefore, the reference numerals shown in FIG. 9 are referred to as to respective parts of the substrate holding part 111.

Figure 16:
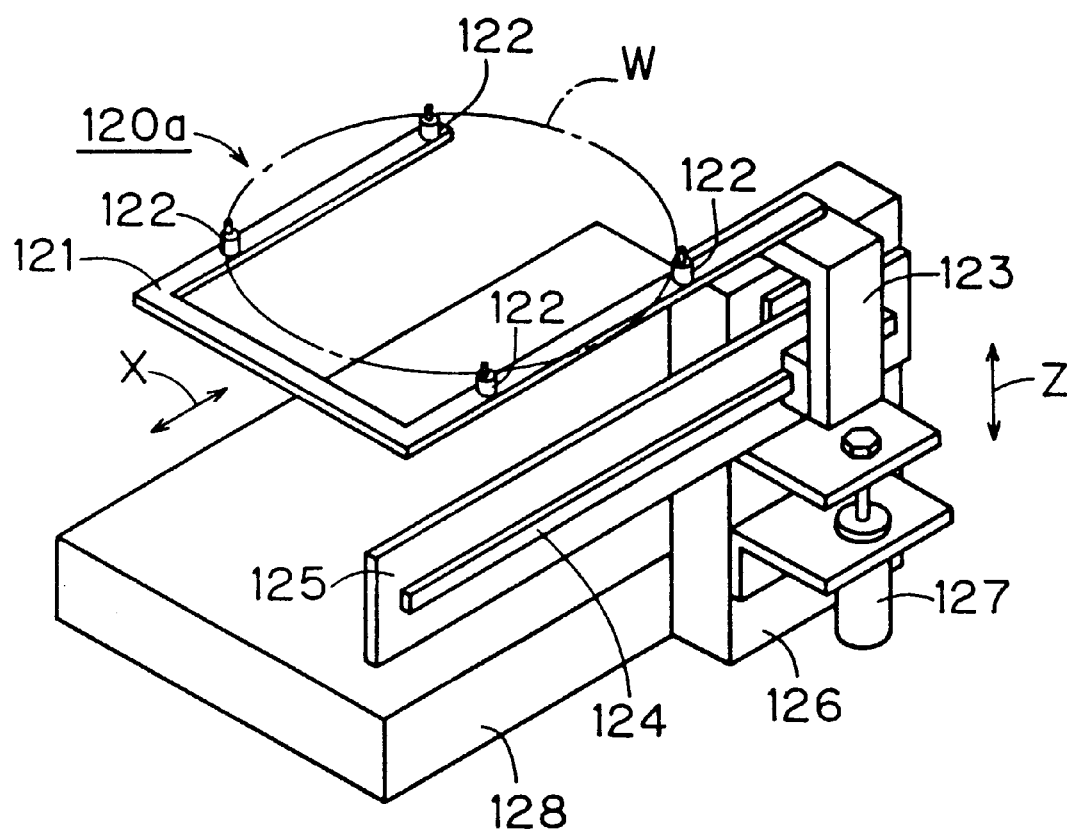
FIG. 16 is a perspective view of a fourth substrate transport robot.

The three third substrate transport robots 120a to 120c are arranged in first to third levels H1 to H3 formed in the Z-axis direction of the second transfer path 31, as shown in FIG. 14. FIG. 16 is a perspective view of the third substrate transport robot 120a. The third substrate transport robot 120a has a substrate support frame 121. Four support pins 122 are arranged on an upper surface of the substrate support frame 121, for supporting an outer peripheral edge of each substrate W. The substrate support frame 121 engages with a horizontally extending guide rail 124 through a coupling part 123. The substrate support frame 121 slides in the horizontal direction (X-axis direction) along the guide rail 124 by a horizontal driving mechanism (not shown). The guide rail 124 is formed on a guide member 125. A lower portion of the guide member 125 is coupled to a rod of a cylinder 127 fixed to a support 126. When the rod of the cylinder 127 expands/contracts, therefore, the guide member 125 moves in the vertical direction, thereby vertically moving the substrate support frame 121.

The support 126 is fixed to a fixed plate 128, which in turn is fixed to a frame 129 formed on a boundary position between the first and second substrate transfer units 20 and 30.

In the aforementioned structure, the first substrate transport robot 110 transfers and receives each substrate W to and from any substrate cassette 43 and any of the third substrate transport robots 120a to 120c. The three third substrate transport robots 120a to 120c transfer and receive the substrates W to and from the first substrate transport robot 110 and the substrate transport robot 22 of the first substrate transfer unit 20 in the corresponding first to third level H1 to H3 respectively.

An exemplary operation of the substrate processing apparatus 1 according to the third embodiment of the present invention is now described. The first substrate transport robot 110 of the second substrate transfer unit 30 takes out each substrate W stored in each substrate cassette 43. In this case, the substrate holding arm 69 of the first substrate transport robot 110 moves in the Y- and Z-axis directions and rotates in the θ-axis direction through the base 114, the support 113 and the movable body 112, and is positioned in front of any substrate cassette 43. Further, the substrate holding arm 69 advances in the X-axis direction, moves under a prescribed substrate W in this substrate cassette 43, is thereafter raised to hold the substrate W, and retreats in the X-axis direction.

The first substrate transport robot 110 transfers the substrate W taken out from the substrate cassette 43 to the third substrate transport robot 120a in the first level H1, as shown in FIG. 14. In this case, the first substrate transport robot 110 moves in the X- and Z-axis directions and rotates in the θ-axis direction through the base 114, the support 113 and the movable body 112, and is positioned in front of the third substrate transport robot 120a. The substrate holding arm 69 of the first substrate transport robot 110 advances in the X-axis direction and the substrate support frame 121 of the third substrate transport robot 120a is raised, whereby the substrate W is transferred from the substrate holding arm 69 of the first substrate transport robot 110 to the substrate support frame 121 of the third substrate transport robot 120a. Thereafter the substrate holding arm 69 of the first substrate transport robot 110 retreats in the X-axis direction.

The third substrate transport robot 120a receiving the substrate W transfers the same to the substrate transport robot 22 of the first substrate transfer unit 20. In this case, the substrate support frame 121 of the third substrate transport robot 120 advances in the X-axis direction. The substrate transport robot 22 moves the substrate holding arm 23 under the substrate W and is thereafter raised, for receiving the substrate W from the substrate support frame 121. Thereafter the substrate support frame 121 retreats in the X-axis direction.

The substrate transport robot 22 of the first substrate transfer unit 20 introduces the substrate W held by the substrate holding arm 23 into any spin coating unit 10a. Thereafter the substrate transport robot 22 discharges the substrate W coated with a resist from the spin coating unit 10a, and transfers the same to either third substrate transport robot 120b or 120c. In case of transfering the substrate W coated with the resist to the exposure apparatus 2b, the substrate transport robot 22 transfers the substrate W to the third substrate transport robot 120b in the second level H2. In case of transfering another substrate W to the exposure apparatus 2a, on the other hand, the substrate transport robot 22 transfers the same to the third substrate transport robot 120c in the third level H3.

The case of transfering the substrate W to the exposure apparatus 2a is now described. The substrate transport robot 22 raises the substrate holding arm 23 holding the substrate W in the Z-axis direction, and transfers the substrate W to the third substrate transport robot 120c in the third level H3. The operation of transferring the substrate W from the substrate transport robot 22 to the third substrate transport robot 120c is performed in a procedure reverse to the aforementioned operation of transferring the substrate W from the third substrate transport robot 120a to the substrate transport robot 22.

When the substrate W is transferred to the substrate support frame 121 of the third substrate transport robot 120c, the substrate holding arm 81 of the second substrate transport robot 80a rotates in the θ-axis direction, advances in the Y-axis direction, moves under the substrate W supported by the substrate support frame 121, is thereafter raised to hold the substrate W, and retreats in the Y-axis direction. Thus, the second substrate transport robot 80a receives the substrate W from the substrate support frame 121.

The substrate holding arm 81 of the second substrate transport robot 80a rotates in the θ-axis direction, advances toward the substrate holding part 90a, places the substrate W on any rack of the substrate holding part 90a, and retreats.

The exposure apparatus 2a fetches the prescribed substrate W from the substrate holding part 90a by the substrate transfer mechanism provided therein, and exposes the same with the exposure part.

The substrate W exposed by the exposure part of the exposure apparatus 2a is placed on the substrate holding part 90a. The second substrate transport robot 80a receives the exposed substrate W from the substrate holding part 90a by the substrate holding arm 81. Further, the second substrate transport robot 80a performs an operation reverse to the above, and transfers the substrate W to the substrate support frame 121 of the third substrate transport robot 120c.

Further, the substrate support frame 121 of the third substrate transport robot 120c advances in the X-axis direction while holding the substrate W, and transfers the same to the substrate holding arm 23 of the substrate transport robot 22. The substrate transport robot 22 introduces the received substrate W into any spin developing unit 10b.

In the case of transfering another substrate W coated with the resist by the spin coating unit 10a to the exposure apparatus 2b, on the other hand, the substrate transport robot 22 raises the substrate holding arm 23 holding the substrate W in the Z-axis direction, and transfers the substrate W to the third substrate transport robot 120b in the second level H2.

When the substrate W is transferred to the substrate support frame 121 of the third substrate transport robot 120b, the substrate holding arm 81 of the second substrate transport robot 80b rotates in the θ-axis direction, moves under the substrate W supported by the substrate support frame 121 of the third substrate transport robot 120b, is thereafter raised, and retreats in the Y-axis direction. Thus, the second substrate transport robot 80b receives the substrate W from the substrate support frame 121.

Further, the substrate holding arm 81 of the second substrate transport robot 80b rotates in the θ-axis direction, advances toward the substrate holding part 90b, places the substrate W in any rack of the substrate holding part 90b and retreats.

The external substrate transport robot 95 moves through the third transfer path 91 in the X-axis direction, and is positioned in front of the substrate holding part 90b. The substrate holding arm 96 advances in the Y-axis direction, moves under the prescribed substrate W, is thereafter raised for holding the substrate W, and retreats in the X-axis direction.

Further, the external substrate transport robot 95 moves through the third transfer path 91 while holding the substrate W, and is positioned in front of the substrate receiving part 53 of the exposure apparatus 2a. The substrate holding arm 96 advances in the X-axis direction and transfers the substrate W to the substrate receiving part 53. Thereafter the substrate holding arm 96 retreats in the Y-axis direction.

The substrate W exposed by the exposure part of the exposure apparatus 2b is transferred from the substrate transfer part 54 to the external substrate transport robot 95, and transferred to the substrate holding part 90b from the external substrate transport robot 95. Further, the second substrate transport robot 80b receives the exposed substrate W from the substrate holding part 90b. The second substrate transport robot 80b performs an operation reverse to the above, and transfers the substrate W from the substrate holding arm 81 of the second substrate transport robot 80b to the substrate support frame 121 of the third substrate transport robot 120b.

In addition, the third substrate transport robot 120b advances the substrate support frame 121 in the X-axis direction, and transfers the substrate W to the substrate transport robot 22 of the first substrate transfer unit 20.

The substrate transport robot 22 of the first substrate transfer unit 20 introduces the received substrate W into another rotary developing unit 10b.

The substrate W completely processed in the substrate processing apparatus 1 is transferred from the substrate transport robot 22 of the first substrate transfer unit 20 to the third substrate transport robot 120a in the first level H1 and further to the first substrate transport robot 110 in the first level H1. The first substrate transport robot 110 stores the completely processed substrate W in the substrate cassette 43.

In the substrate processing apparatus 1 according to the third embodiment of the present invention, substrates W processed in the respective rotary coating units 10a are distributed to the two exposure apparatuses 2a and 2b similarly to the substrate processing apparatuses 1 according to the first and second embodiments of the present invention, whereby reduction of the operational efficiency of the substrate processing apparatus 1 resulting from incoincident throughput of the substrate processing apparatus 1 and the exposure apparatuses 2a and 2b can be avoided or relieved. Further, external apparatuses such as the exposure apparatuses 2a and 2b can be provided on both sides of the substrate processing apparatus 1, whereby layout flexibility is increased. Consequently, a dead space in a clean room can be reduced.

In the third embodiment, further, the three third substrate transport robots 120a to 120c are arranged in the vertical direction, whereby the substrates W transferred between the first substrate transport robot 110 and the substrate transport robot 22 of the first substrate transfer unit 20 can be temporarily held in the third substrate transport robots 120a to 120c. Thus, adjustment of incoincidence of the throughput of the substrate processing apparatus 1 and the exposure apparatuses 2a and 2b can be further simplified, and waste times of substrate processes can be eliminated.

Figure 17:
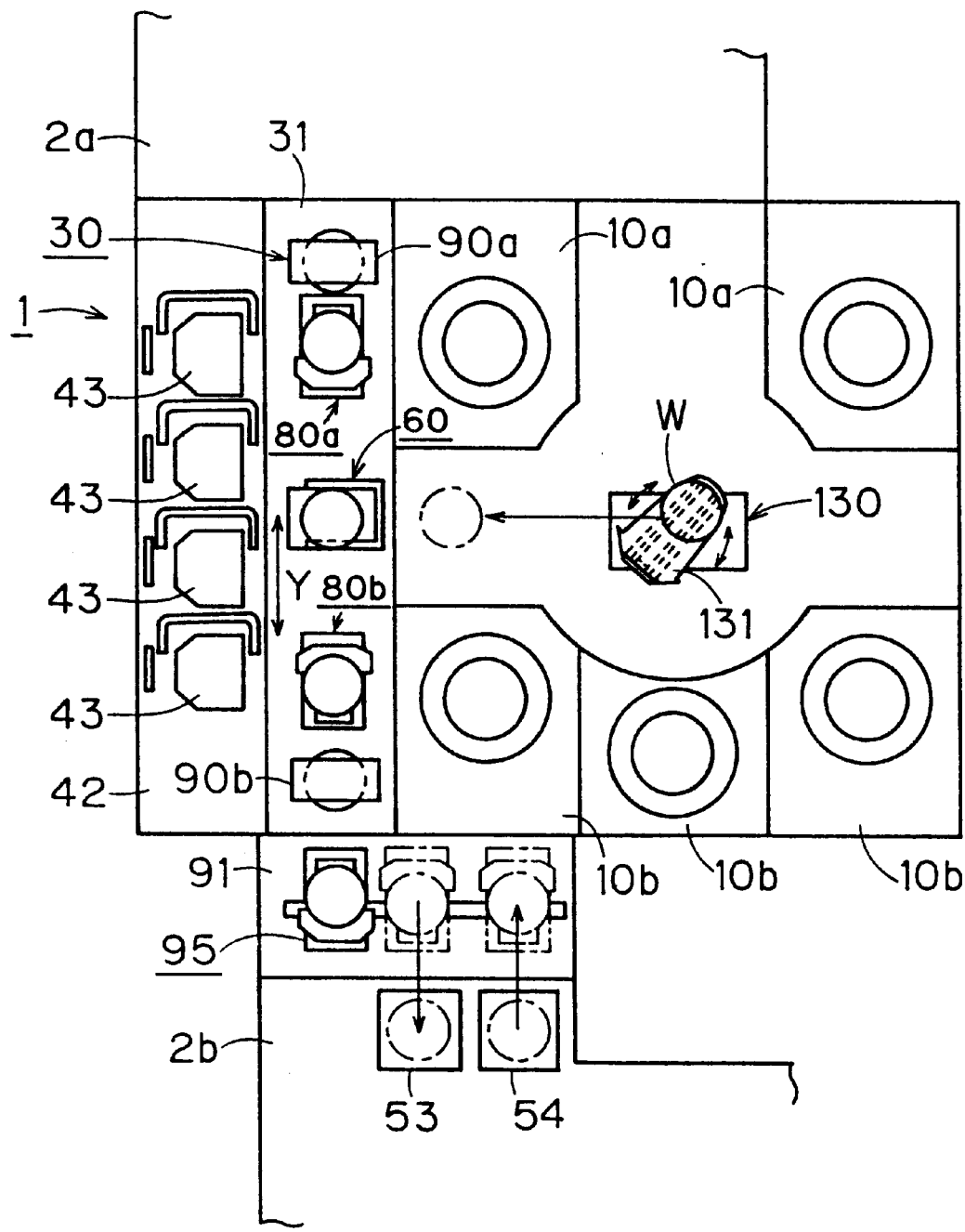
FIG. 17 is a plan view of a substrate processing apparatus according to a fourth embodiment of the present invention.

FIG. 17 is a plan view of a substrate processing apparatus 1 according to a fourth embodiment of the present invention. The substrate processing apparatus 1 according to the fourth embodiment of the present invention is different from the substrate processing apparatus 1 according to the second embodiment only in the structure of a substrate processing part. Referring to FIG. 17, therefore, parts having structures identical to those in the second embodiment are denoted by the same reference numerals.

In the substrate processing part of the substrate processing apparatus 1 shown in FIG. 17, a plurality of spin coating units 10a and a plurality of spin developing units 10b are arranged to enclose a substrate transport robot 130. The substrate transport robot 130 has a substrate holding arm 131 for holding each substrate W. The substrate holding arm 131 is formed to be vertically movable and rotatable about a vertical axis. Further, the substrate holding arm 131 expands and contracts in the horizontal direction. The substrate transport robot 130 transfers and receives each substrate W to and from a first substrate transport robot 60 through the substrate holding arm 131, transfers each substrate W to any rotary coating unit 10a and any rotary developing unit 10b, and discharges each processed substrate W. The substrate transport robot 130 corresponds to transport means of the present invention.

Also in the substrate processing apparatus 1 having such a substrate processing part, reduction of operational efficiency resulting from incoincident throughput of the substrate processing apparatus 1 and exposure apparatuses 2a and 2b can be avoided or relieved, similarly to the substrate processing apparatuses 1 according to the first and second embodiments of the present invention.

The substrate processing part of the substrate processing apparatus 1 according to the first or third embodiment can be replaced with that of the substrate processing apparatus 1 according to the fourth embodiment of the present invention.

While the invention has been shown and described in detail, the foregoing description is in all aspects illustrative and not restrictive. It is therefore understood that numerous modifications and variations can be devised without departing from the scope of the invention.

We claim:

1. A substrate processing apparatus comprising:
 a) a processing section comprising:
   a-1) substrate processing means for processing a substrate;
 b) a transfer section provided adjacent to said processing section and comprising:
   b-1) a transfer path defined along one side of said processing section; and
   b-2) transfer means movable along said transfer path for transferring said substrate between said processing section and both terminals of said transfer path, said transfer means being capable of introducing and discharging a substrate into and from said transfer path at both terminals of said transfer path, said transfer means comprising:
     b-2-1) first substrate-transfer means capable of having access to said substrate processing means and said substrate station; and
     b-2-2) second substrate-transfer means comprising:
       a first transfer unit capable of having access to one terminal of said transfer path; and
       a second transfer unit capable of having access to the other terminal of said transfer path; and
 c) a substrate station provided on an opposite side of said processing section across said transfer path.

2. The substrate processing apparatus in claim 1, wherein said substrate station has cassette positions for accepting cassettes each capable of containing a plurality of substrates.

3. The substrate processing apparatus in claim 1, wherein said first substrate-transfer means comprises:
 a first moving part movable along said transfer path;
 a second moving part provided on said first moving part, movable vertically, and rotatable about a vertical axis; and a first holding part for holding said substrate, provided on said second moving part and movable horizontally, and each of said first and second transfer units comprises:

a fixed part fixed on said transfer path;

a third moving part provided on said fixed part, movable vertically, and rotatable about a vertical axis; and a second holding part for holding said substrate, provided on said third moving part and movable horizontally.

4. The substrate processing apparatus in claim 3, wherein said substrate station has cassette positions for accepting cassettes each capable of containing a plurality of substrates.

5. The substrate processing apparatus in claim 4, wherein said first and second transfer units are provided at different levels.

6. The substrate processing apparatus in claim 1, further comprising:

c) substrate holding means comprising:

d-1) a first substrate-holding part provided on one terminal of said transfer path; and d-2) a second substrate-holding part provided on the other terminal of said transfer path, wherein said transfer means is operable to have access to said first and second substrate-holding parts.

7. The substrate processing apparatus in claim 6, further comprising:

e) an interface transfer means for transferring said substrate between one of said first and second substrate-holding parts and an external apparatus.

8. The substrate processing apparatus in claim 7, wherein said interface transfer means is movable along a predetermined external transport path.

9. The substrate processing apparatus in claim 1, wherein said substrate processing means comprises:

a-1-1) a plurality of processing units for processing said substrate, and said processing section further comprises:

a-2) transport means for transporting said substrate between said plurality of processing units and said transfer means.

10. The substrate processing apparatus in claim 9, wherein said transport means is movable along a predetermined transport path defined in said processing section.

11. The substrate processing apparatus in claim 10, wherein said transport path is perpendicular to said transfer path.

12. The substrate processing apparatus in claim 9, wherein said plurality of processing units are arranged around said transport means.

13. The substrate processing apparatus in claim 12, wherein said transport means comprises:

a-2-1) a rotatable part rotatable about a vertical axis; and a-2-2) a holding arm provided on said rotatable part and operable to hold said substrate and to have access to said plurality of processing units.

14. The substrate processing apparatus in claim 9, wherein said substrate processing means comprises:

a coating unit for coating said substrate.

15. The substrate processing apparatus in claim 9, wherein said substrate processing means comprises:

a developing unit for developing said substrate.

16. A substrate processing apparatus comprising:

a) a processing section comprising:

a-1) substrate processing means for processing a substrate;

b) a transfer section provided adjacent to said processing section and comprising:

b-1) a transfer path defined long one side of said processing section; and b-2) transfer means movable along said transfer path for transferring said substrate between said processing section and both terminals of said transfer path, said transfer means being capable introducing and discharging a substrate into and from said transfer path in both terminals of said transfer path at both terminals of said transfer path; said transfer means comprising:

b-2-1) first substrate-transfer means capable of having access to said substrate station;

b-2-2) second substrate-transfer means comprising:

a first transfer means capable of having access to one terminal of said transfer path, and a second transfer unit capable of having access to the other terminal of said transfer path; and b-2-3) third substrate means capable of having access to said substrate processing means, said first substrate-transfer means and said second substrate means; and c) a substrate station provided on an opposite side of said processing section across said transfer path.

17. The substrate processing apparatus in claim 16, wherein said first substrate-transfer means comprises:

a first moving part movable along said transfer path;

a second moving part provided on said first moving part, movable vertically, and rotatable about a vertical axis; and a first holding part for holding said substrate, provided on said second moving part and movable horizontally, and each of said first and second transfer units comprises:

a fixed part fixed beside said transfer path;

a third moving part provided on said fixed part, movable vertically, and rotatable about a vertical axis; and a second holding part for holding said substrate, provided on said third moving part and movable horizontally.

18. The substrate processing apparatus in claim 17, wherein said substrate station has cassette positions for accepting cassettes each capable of containing a plurality of substrates.

19. The substrate processing apparatus in claim 18, wherein said first and second transfer units are provided at different levels.

20. The substrate processing apparatus in claim 19, wherein said third substrate-transfer means comprises:

a first transfer portion capable of having access to said first substrate-transfer means at a first level;

a second transfer portion capable of having access to said first transfer unit at a second level; and a third transfer portion capable of having access to said second transfer unit at a third level.

21. The substrate processing apparatus in claim 20, wherein each of said first to third transfer portions comprises:

a fixed part fixed beside said transfer path;

a moving part provided on said fixed part, movable vertically, and rotatable about a vertical axis; and a third holding part for holding said substrate, provided on said moving part and movable horizontally.

* * * * *